US012763740B2

(12) United States Patent
Sukemori et al.

(10) Patent No.: US 12,763,740 B2
(45) Date of Patent: Oct. 13, 2026

(54) POWER AMPLIFIER CIRCUIT

(71) Applicant: Murata Manufacturing Co., Ltd., Kyoto (JP)

(72) Inventors: Yoshiaki Sukemori, Kyoto (JP); Kenji Tahara, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 455 days.

(21) Appl. No.: 18/392,166

(22) Filed: Dec. 21, 2023

(65) Prior Publication Data

US 2024/0128940 A1 Apr. 18, 2024

Related U.S. Application Data

(63) Continuation of application No. PCT/JP2022/024873, filed on Jun. 22, 2022.

(30) Foreign Application Priority Data

Jun. 24, 2021 (JP) ................................ 2021-104804

(51) Int. Cl.

| | |
|---|---|
| ***H03F 1/02*** | (2006.01) |
| ***H01P 5/16*** | (2006.01) |
| ***H03F 1/56*** | (2006.01) |
| ***H03F 3/24*** | (2006.01) |

(52) U.S. Cl.

CPC ............... *H03F 3/245* (2013.01); *H01P 5/16* (2013.01); *H03F 1/56* (2013.01); *H03F 2200/222* (2013.01); *H03F 2200/387* (2013.01); *H03F 2200/451* (2013.01)

(58) Field of Classification Search

CPC . H03F 1/02; H03F 1/07; H03F 1/0205; H03F 1/0211

See application file for complete search history.

(56) References Cited

U.S. PATENT DOCUMENTS

| | | | | |
|---|---|---|---|---|
| 2003/0137346 | A1 | 7/2003 | Hellberg | |
| 2005/0185710 | A1* | 8/2005 | Gai .................... | H03F 3/45973 375/232 |
| 2006/0164163 | A1 | 7/2006 | Apel et al. | |
| 2007/0096823 | A1 | 5/2007 | Wang et al. | |
| 2007/0139105 | A1 | 6/2007 | Kennan | |
| 2012/0200353 | A1 | 8/2012 | Hayakawa et al. | |

(Continued)

FOREIGN PATENT DOCUMENTS

| | | | |
|---|---|---|---|
| JP | 2004-503161 | A | 1/2004 |
| JP | 2015-207941 | A | 11/2015 |
| WO | 2011/046031 | A1 | 4/2011 |

OTHER PUBLICATIONS

International Search Report for PCT/JP2022/024873 dated Sep. 13, 2022.

*Primary Examiner* — Henry Choe

(74) *Attorney, Agent, or Firm* — McDonald Hopkins LLC

(57) ABSTRACT

There is provided a power amplifier circuit capable of adjusting the gain according to the power mode. A power amplifier circuit includes: a splitter outputting an input signal by splitting the input signal to a signal RF1 and a signal RF2; amplifiers connected to the splitter; and an amplifier provided in or on a signal path branching from between the splitter and an input of the amplifier, connected in parallel with the amplifier, and connected to a biasing terminal supplied with a third bias current or voltage.

20 Claims, 12 Drawing Sheets

(56) References Cited

U.S. PATENT DOCUMENTS

| | | | | |
|---|---|---|---|---|
| 2024/0113668 | A1 * | 4/2024 | Tahara | H03F 3/195 |
| 2024/0171140 | A1 * | 5/2024 | Tahara | H03F 3/195 |
| 2024/0429871 | A1 * | 12/2024 | Tahara | H03F 1/565 |
| 2025/0007467 | A1 * | 1/2025 | Tokuda | H03F 1/0288 |

* cited by examiner

POWER AMPLIFIER CIRCUIT

CROSS REFERENCE TO RELATED APPLICATION

This is a continuation of International Application No. PCT/JP2022/024873 filed on Jun. 22, 2022 which claims priority from Japanese Patent Application No. 2021-104804 filed on Jun. 24, 2021. The contents of these applications are incorporated herein by reference in their entireties.

BACKGROUND ART

Technical Field

The present disclosure relates to a power amplifier circuit.

The Doherty amplifier circuit, which is one of the power amplifier circuits, is a highly efficient power amplifier circuit. In the Doherty amplifier circuit, generally a carrier amplifier that operates regardless of the power level of an input signal and a peak amplifier that is turned off when the power level of the input signal is small and turned on when the power level is large are connected in parallel. When the power level of the input signal is large, the carrier amplifier operates while maintaining saturation at a saturated output power level. The Doherty amplifier circuit can improve the efficiency compared to ordinary power amplifier circuits.

Patent Document 1 describes a circuit, in a Doherty amplifier circuit, which reduces the standby current of the Doherty amplifier circuit by controlling on/off of bias supplied to a driver stage of a peak amplifier according to the power level of an output signal.

Patent Document 1: Japanese Unexamined Patent Application Publication No. 2015-207941

BRIEF SUMMARY

In the Doherty amplifier circuit, the impedance as seen from the collector end of the carrier amplifier towards the output side changes according to the power level of the input signal. This creates an impedance state in the Doherty amplifier so that the circuit operates highly efficiently even in a power mode in which the power level of the input signal is low (low power mode). Specifically, the impedance is high in the low power mode. A higher impedance in the low power mode in which only the carrier amplifier operates results in a higher gain of the Doherty amplifier.

In addition to reducing the standby current as in the circuit described in Patent Document 1, it may be suitable in the Doherty amplifier to lower the gain of the Doherty amplifier circuit when the power levels of the input signal and the output signal are small.

The present disclosure provides a power amplifier capable of adjusting the gain according to the power mode.

A power amplifier circuit according to one aspect of the present disclosure includes: an input signal path to which an input signal is input; a splitter connected to the input signal path and outputting the input signal by splitting the input signal to a first signal and a second signal; a first signal path connected to the splitter and receiving the first signal; a second signal path connected to the splitter and receiving the second signal; a first amplifier provided in or on the first signal path and connected to a first biasing terminal supplied with a first bias current or voltage; a second amplifier provided in or on the second signal path and connected to a second biasing terminal supplied with a second bias current or voltage; a third signal path branching from between the splitter and an input of the first amplifier; a third amplifier provided in or on the third signal path, connected in parallel with the first amplifier, and connected to a third biasing terminal supplied with a third bias current or voltage; at least one impedance element provided in or on the third signal path and connected to the third amplifier; a first amplifier section provided in or on the first signal path, connected to an output of the first amplifier and an output of the third amplifier, and outputting a third signal based on the first signal; a second amplifier section provided in or on the second signal path, connected to an output of the second amplifier, and outputting a fourth signal based on the second signal; and a combiner connected to the first signal path and the second signal path, and outputting a fifth signal combining the third signal and the fourth signal.

According to the present disclosure, it is possible to provide a power amplifier capable of adjusting the gain according to the power mode.

DETAILED DESCRIPTION

Figure 1:
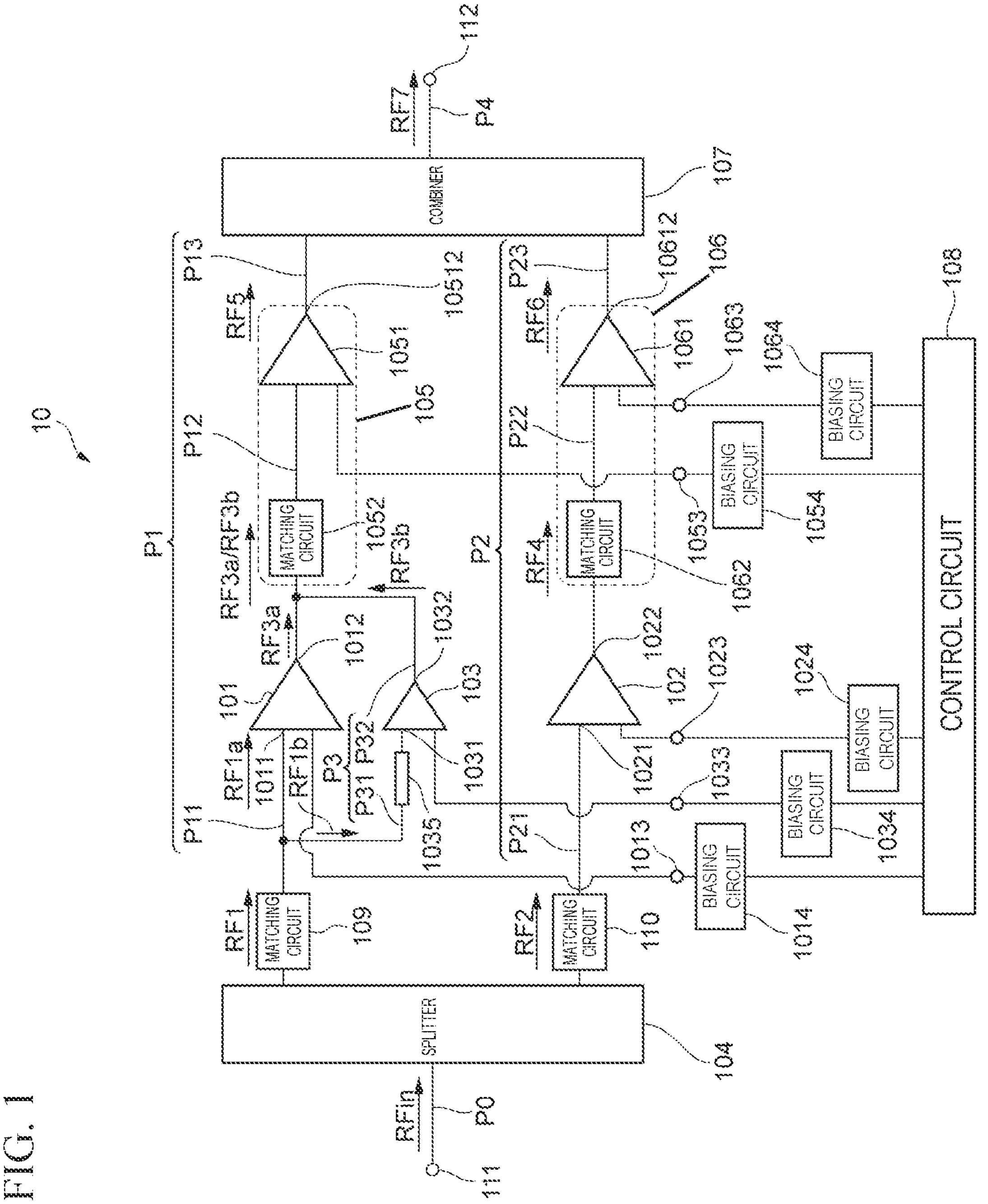
FIG. 1 is a block diagram of a power amplifier circuit according to a first embodiment.

A first embodiment will be described. FIG. 1 illustrates a block diagram of a power amplifier circuit 10 according to the first embodiment. The power amplifier circuit 10 has amplifiers 101, 102, and 103, an impedance element 1035, a splitter 104, amplifier sections 105 and 106, a combiner 107, and a control circuit 108. The power amplifier circuit 10 also has an input signal path P0 and a signal path P1 (first signal path), a signal path P2 (second signal path), a signal path P3 (third signal path), and a signal path P4 (fourth signal path). The input signal path P0 or the signal paths P1 to P4 are paths through which signals flow, and include wiring of the power amplifier circuit 10 and circuit elements provided to be connected through the wiring. The power amplifier circuit 10 also has biasing circuits 1014, 1024, 1034, 1054, and 1064. The power amplifier circuit 10 also has matching circuits 1052, 1062, 109, and 110. Each matching circuit has the function of matching the impedance between circuit elements connected to the matching circuit.

The power amplifier circuit 10 performs power amplification according to the power level of an input signal RFin input through an input end 111. The power mode of power amplification in the power amplifier circuit 10 has three modes. These power modes are referred to as a first power mode, a second power mode, and a third power mode.

The power level of an output signal in the first power mode is higher than the power level of an output signal in the second power mode. The power level of an output signal in the third power mode is higher than the power level of an output signal in the second power mode and lower than the power level of an output signal in the first power mode.

The first power mode is a high power mode (HPM) (first power mode) in which a signal amplified by the amplifier 101 and an amplifier 1051 and a signal amplified by the amplifier 102 and an amplifier 1061 are combined to perform power amplification.
The high power mode is a power mode in the case where the power level of a signal RF7, which is the output signal of the power amplifier circuit 10, is high.

The second power mode is a low power mode (LPM) (second power mode) in which power amplification is performed only by the amplifier 103 and the amplifier 1051, and the amplifier 102 and the amplifier 1061 perform no power amplification. The low power mode is a power mode in the case where the power level of the signal RF7 is lower than that in the high power mode.

The third power mode is a middle power mode (MPM) (third power mode) in which power amplification is performed only by the amplifier 101 and the amplifier 1051, and the amplifier 102 and the amplifier 1061 perform no power amplification. The middle power mode is a power mode in the case where the power level of the signal RF7 is lower than that in the high power mode and higher than that in the low power mode.

In the power amplifier circuit 10, the input signal RFin input through the input end 111 is input to the splitter 104 through the input signal path P0. The splitter 104 splits the input signal RFin to a signal RF1 (first signal) and a signal RF2 (second signal). The signal RF1 and the signal RF2 differ in phase by about 90°. The splitter 104 is connected to the signal path P1 and the signal path P2. The signal RF1 is input from the splitter 104 to the signal path P1. The signal RF2 is input from the splitter 104 to the signal path P2. Differing in phase by about 90° in the present disclosure is defined as 90°±45°.

The amplifier 101 (first amplifier) is provided in or on the signal path P1. An input 1011 is connected to a signal path P11, which is part of the signal path P1, and is connected to the splitter 104 through the matching circuit 109. An output 1012 is connected to a signal path P12, which is part of the signal path P1.

The amplifier 102 (second amplifier) is provided in or on the signal path P2. An input 1021 is connected to a signal path P21, which is part of the signal path P2, and is connected to the splitter 104 through the matching circuit 110. An output 1022 is connected to a signal path P22, which is part of the signal path P2.

The amplifier 103 (third amplifier) is provided in or on the signal path P3, which branches from between the input 1011 of the amplifier 101 and the splitter 104 in the signal path P1. The amplifier 103 is connected in parallel with the amplifier 101. In the amplifier 103, an input 1031 is connected to a signal path P31, which is part of the signal path P3. An output 1032 is connected to a signal path P32, which is part of the signal path P3. The amplifier 103 is connected to the signal path P11 through the impedance element 1035 (first impedance element). Note that the impedance element 1035 is, for example, a resistive element, a capacitor, or an inductor. The amplifier 103 may also be connected to the signal path P11 through the impedance element 1035 and another impedance element (not illustrated), which is a resistive element, a capacitor, or an inductor. In other words, the amplifier 103 may be connected to the signal path P11 through a circuit combining two or more impedance elements, which are resistive elements, capacitors, or inductors. The output 1032 of the amplifier 103 is connected to the signal path P12 and is connected to the output 1012 of the amplifier 101.

The amplifier 101 is connected to a biasing circuit 1014 (first biasing circuit) through a biasing terminal 1013 (first biasing terminal). The amplifier 102 is connected to a biasing circuit 1024 (second biasing circuit) through a biasing terminal 1023 (second biasing terminal). The amplifier 103 is connected to a biasing circuit 1034 (third biasing circuit) through a biasing terminal 1033 (third biasing terminal). The amplifiers 101, 102, and 103 are supplied with a bias current or voltage from the respective biasing circuits through the respective biasing terminals. The amplifiers 101, 102, and 103 are turned on and perform power amplification when supplied with a bias current or voltage, and are turned off and perform no power amplification when supplied with no bias current or voltage.

The amplifier section 105 (first amplifier section) is provided in or on the signal path P1. The amplifier section 105 has the amplifier 1051 and a matching circuit 1052. The amplifier 1051 is connected to the output 1012 of the amplifier 101 and the output 1032 of the amplifier 103 through the matching circuit 1052. An output 10512 is connected to a signal path P13, which is part of the signal path P1.

The amplifiers 101, 103, and 1051 are carrier amplifiers in the power amplifier circuit 10 operating as a Doherty amplifier. The amplifiers 101, 103, and 1051 are biased to perform class A or class AB operation.

The amplifier section 106 (second amplifier section) is provided in or on the signal path P2. The amplifier section 106 has the amplifier 1061 and a matching circuit 1062. The amplifier 1061 is connected to the output 1022 of the amplifier 102 through the matching circuit 1062. An output 10612 is connected to a signal path P23, which is part of the signal path P2.

The amplifiers 102 and 1061 are peak amplifiers in the power amplifier circuit 10. The amplifiers 102 and 1061 are biased to perform class A or class AB operation in the power amplifier circuit 10. Note that the peak amplifiers may be biased to perform class C operation.

In the case where the amplifier 1051 is configured to perform differential amplification, the matching circuit 1052 has the function of splitting a signal. Also, in the case where the amplifier 1051 performs single amplification rather than differential amplification, the matching circuit 1052 can be a general matching circuit. That is, as long as the amplifier section 105 has the function of amplifying a signal from the amplifier 101 or the amplifier 103, the specific configuration of the amplifier 1051 and the matching circuit 1052 is not limited. The same is true for the amplifier section 106.

The amplifier 1051 is connected to a biasing circuit 1054 through a biasing terminal 1053. The amplifier 1061 is connected to a biasing circuit 1064 through a biasing terminal 1063. The amplifiers 1051 and 1061 are supplied with a bias current or voltage from the respective biasing circuits through the respective biasing terminals. The amplifiers 1051 and 1061 are turned on and perform power amplification when supplied with a bias current or voltage, and are turned off and perform no power amplification when supplied with no bias current or voltage.

The combiner 107 is provided to be connected to the signal path P1 and the signal path P2. The combiner 107 combines a signal RF5 input through the signal path P1 and a signal RF6 input through the signal path P2. The combined signal is output as the signal RF7 to an output end 112 through the signal path P4.

The control circuit 108 is connected to the biasing circuits 1014, 1024, 1034, 1054, and 1064. The control circuit 108 switches each biasing circuit on and off by sending a control signal to each biasing circuit. Each biasing circuit operates to be able to supply a bias current or voltage when it is on and not to supply a bias current or voltage when it is off.

The operation of power amplification in the power amplifier circuit 10 in each of the power modes including the high power mode, the low power mode, and the middle power mode will be described.

In the high power mode, the control circuit 108 controls the biasing circuits 1014, 1024, 1054, 1064 to be on. That is, the amplifiers 101, 102, 1051, and 1061 are biased so that they may each be able to perform power amplification. At this time, since the amplifier 103 does not receive the supply of a bias current or voltage, the amplifier 103 does not perform power amplification.

The input signal RFin is split by the splitter 104 to the signal RF1 (first signal) and the signal RF2 (second signal). The signal RF1 is supplied to the amplifier 101. The amplifier 101 amplifies the signal RF1 and outputs a signal RF3*a*. At this time, the signal RF1 is not supplied to the amplifier 103, which is not biased to be able to perform power amplification.

The signal RF2 is supplied to the amplifier 102. The amplifier 102 amplifies the signal RF2 and outputs a signal RF4.

The signal RF3*a* from the amplifier 101 is supplied to the amplifier 1051 of the amplifier section 105. The amplifier 1051 amplifies the signal RF3*a* and outputs the signal RF5 (third signal).

The signal RF4 from the amplifier 102 is supplied to the amplifier 1061 of the amplifier section 106. The amplifier 1061 amplifies the signal RF4 and outputs the signal RF6 (fourth signal)

The signal RF5 and the signal RF6 are supplied to the combiner 107. The combiner 107 combines the signal RF5 and the signal RF6 to output the signal RF7 (fifth signal).

In the low power mode, the control circuit 108 controls the biasing circuits 1034 and 1054 to be on. That is, the amplifiers 103 and 1051 are biased so that they may each be able to perform power amplification. Since the amplifiers 101, 102, and 1061 do not receive the supply of a bias current or voltage, the amplifiers 101, 102, and 1061 do not perform power amplification.

Unlike in the high power mode, the signal RF2 in the low power mode is not supplied to the amplifier 102, which is not biased. That is, the input signal RFin is amplified as the signal RF1. The signal RF1 is supplied to the amplifier 103 with power consumption associated with passing through the impedance element 1035. The amplifier 103 amplifies the signal RF1 and outputs a signal RF3*b*.

The signal RF3*b* from the amplifier 103 is supplied to the amplifier 1051 of the amplifier section 105. The amplifier 1051 amplifies the signal RF3*b* and outputs the signal RF5 (third signal).

The signal RF5 is supplied to the combiner 107. The combiner 107 outputs the signal RF5 as the signal RF7 (fifth signal).

In the middle power mode, the control circuit 108 controls the biasing circuits 1014 and 1054 to be on. That is, the amplifiers 101 and 1051 are biased so that they may each be able to perform power amplification. Since the amplifiers 103, 102, and 1061 do not receive the supply of a bias current or voltage, the amplifiers 103, 102, and 1061 do not perform power amplification.

Like in the low power mode, the signal RF2 in the middle power mode is not supplied to the amplifier 102, which is not biased. That is, the input signal RFin is amplified as the signal RF1. The signal RF1 is supplied to the amplifier 101. The amplifier 101 amplifies the signal RF1 and outputs the signal RF3*a*. Here, since the signal RF3*a* is based on a signal RF1*a*, which is without necessarily power consumption by the impedance element 1035, the power of the signal RF3*a* is higher than the signal RF3*b*.

The signal RF3*a* from the amplifier 101 is supplied to the amplifier 1051 of the amplifier section 105. The amplifier 1051 amplifies the signal RF3*a* and outputs the signal RF5.

The signal RF5 is supplied to the combiner 107. The combiner 107 outputs the signal RF5 as the signal RF7. The middle power mode corresponds to a power mode in which only the carrier amplifiers operate in a Doherty amplifier which is commonly used.

In the power amplifier circuit 10 according to the present embodiment, power consumption of the impedance element 1035 occurs in the low power mode, and the amplitude of the signal decreases, resulting in a lower gain than that in the middle power mode.

Figure 2:
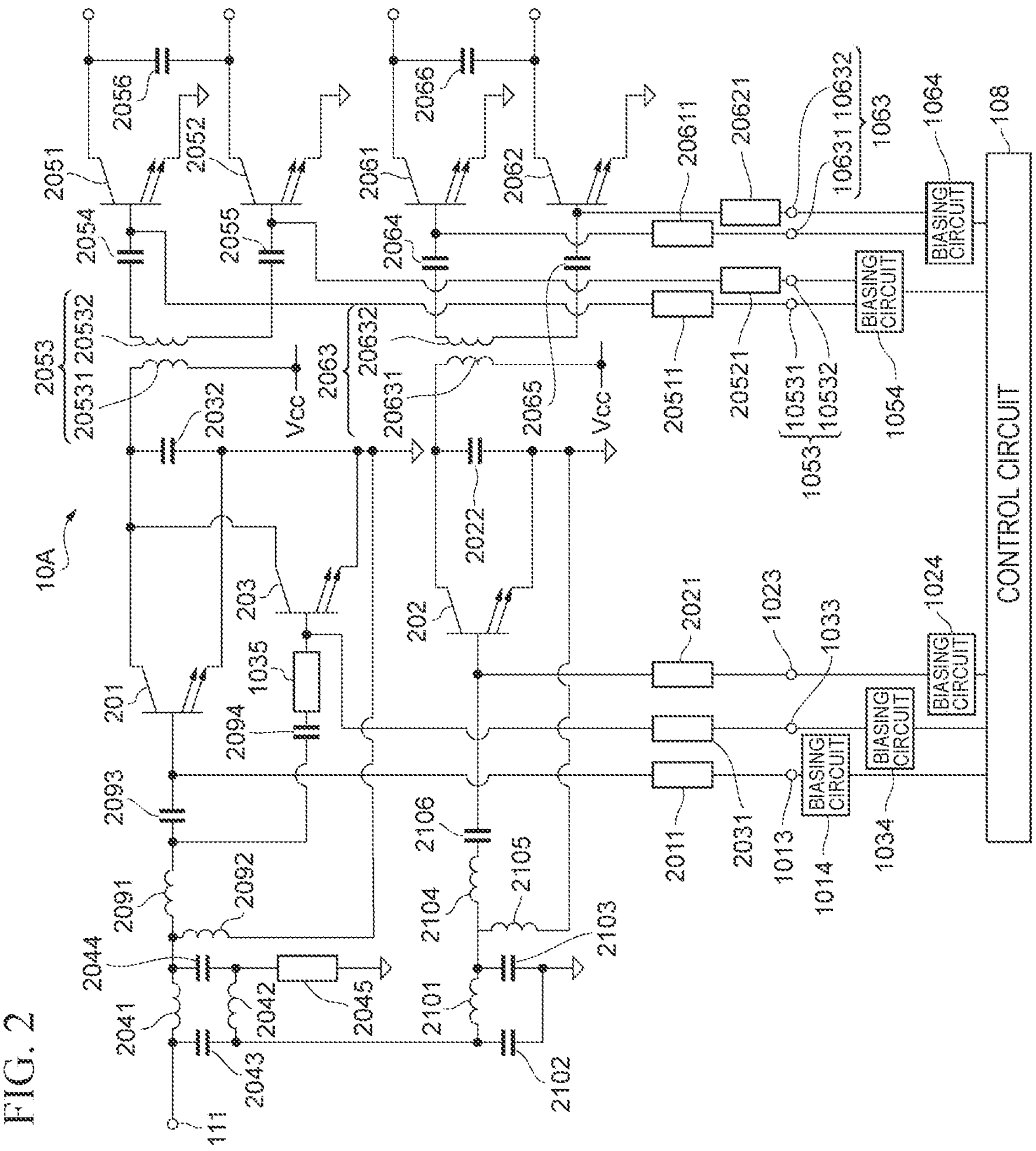
FIG. 2 is a circuit diagram of the power amplifier circuit according to the first embodiment.

FIG. 2 illustrates an example of a circuit diagram of the power amplifier circuit 10 as a power amplifier circuit 10A. In the power amplifier circuit 10A, the amplifiers 101, 102, and 103 are provided as transistors 201 (first transistor), 202, and 203 (second transistor). The amplifier 1051 is a differential amplifier having transistors 2051 and 2052. The amplifier 1061 is also a differential amplifier having transistors 2061 and 2062. Each transistor is, for example, a transistor such as a heterojunction bipolar transistor (HBT). Although the configuration of a bipolar transistor is illustrated in the present disclosure, it may be replaced with a field effect transistor (FET). In that case, the collector may be replaced with a drain, the base with a gate, and the emitter with a source.

A capacitor 2032 is provided between the emitter of the transistor 201 and the collector of the transistor 203 and ground. A capacitor 2022 is provided between the collector of the transistor 202 and ground. The capacitor 2032 is part of a matching circuit that matches the impedance as seen from the emitter of the transistor 201 and the collector of the transistor 203 towards the output side.

The base of the transistor 201 is connected to the biasing circuit 1014 through a resistive element 2011. The base of the transistor 203 is connected to the biasing circuit 1034 through a resistive element 2031. The resistive element 2031 is provided to suppress the thermal runaway of the transistor 201.

The emitter of the transistor 201 and the emitter of the transistor 203 are connected to a transformer 2053 having a primary coil 20531 and a secondary coil 20532. The transistors 201 and 203 are supplied with a power supply voltage Vcc through the primary coil 20531.

The emitter of the transistor 202 is connected to a transformer 2063 having a primary coil 20631 and a secondary coil 20632. The transistor 202 is supplied with the power supply voltage Vcc through the primary coil 20631.

The transistors 201, 202, and 203 are multi-finger transistors having a plurality of unit transistors. Here, the emitter size of the transistor 201 operating in the high power mode and the middle power mode can be made larger than the emitter size of the transistor 203 operating only in the low power mode.

The emitter size is, when a transistor is formed on a substrate, the area occupied by the emitter on the surface of the substrate. Specifically, the emitter size may change depending on the horizontal width and vertical width of the emitter on the surface of the substrate and the number of fingers. The emitter size is the size according to the current value flowing through the transistor. Therefore, the emitter size of a transistor corresponding to the high power mode, which is a mode in which the flow of current is large, is larger than the emitter size of a transistor corresponding to the low power mode, which is a mode in which the flow of current is small. For example, the ratio of the emitter size of the transistor 203 to the emitter size of the transistor 201 may be set to 1:3.

The splitter 104 is configured to have inductors 2041 and 2042, capacitors 2043 and 2044, and a resistive element 2045. The matching circuit 109 is configured to have inductors 2091 and 2092 and capacitors 2093 and 2094. The matching circuit 110 is configured to have inductors 2101, 2104, and 2105 and capacitors 2102, 2103, and 2106. Note that the inductor 2101 and the capacitors 2102 and 2103 are elements provided for phase adjustment of signals input to 202.

The base of the transistor 2051 is connected to the secondary coil 20532 through a capacitor 2054. The base of the transistor 2052 is connected to the secondary coil 20532 through a capacitor 2055. In the power amplifier circuit 10A, the transformer 2053 may function as the matching circuit 1052.

Also, the base of the transistor 2051 is connected to the biasing circuit 1054 through a resistive element 20511 and a biasing terminal 10531. The base of the transistor 2052 is connected to the biasing circuit 1054 through a resistive element 20521 and a biasing terminal 10532.

The collector of the transistor 2051 is connected to the collector of the transistor 2052 through a capacitor 2056.

The base of the transistor 2061 is connected to the secondary coil 20632 through a capacitor 2064. The base of the transistor 2062 is connected to the secondary coil 20632 through a capacitor 2065. In the power amplifier circuit 10A, the transformer 2063 may function as the matching circuit 1052.

The collector of the transistor 2061 is connected to the collector of the transistor 2062 through a capacitor 2066.

Signals from the respective collectors of the transistors 2051, 2052, 2061, and 2062 are combined by the combiner 107.

Figure 3:
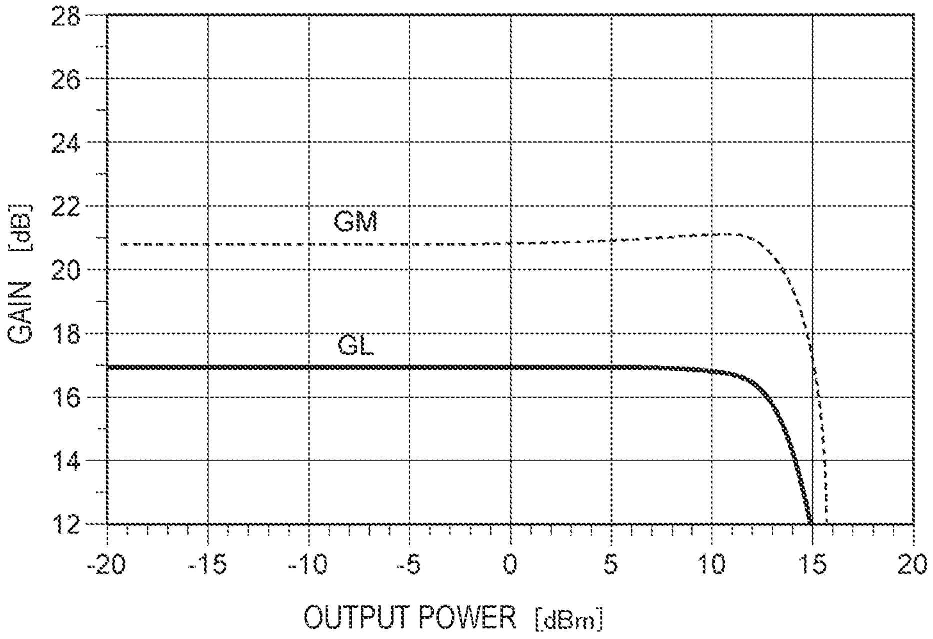
FIG. 3 is a diagram describing gains in the power amplifier circuit according to the first embodiment.

Referring to FIG. 3, the gain of the power amplifier circuit 10 will be described. In FIG. 3, the gain in the middle power mode is indicated by a curve GM, and the gain in the low power mode is indicated by a curve GL, respectively. As illustrated in FIG. 3, in the power amplifier circuit 10, because power attenuation through the impedance element 1035 occurs in the low power mode, the gain in the low power mode is smaller than that in the middle power mode.

Figure 4:
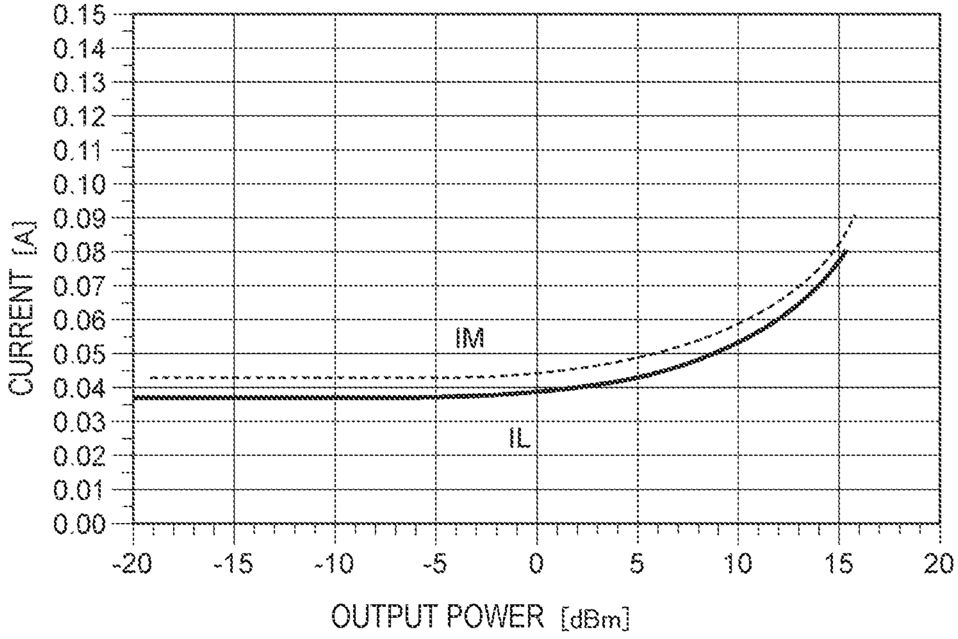
FIG. 4 is a diagram describing current values in the power amplifier circuit according to the first embodiment.

Referring to FIG. 4, the collector current in the power amplifier circuit 10A will be described. In FIG. 4, the collector current of the transistor 201 in the middle power mode is indicated by a curve IM, and the collector current of the transistor 203 in the low power mode is indicated by a curve IL, respectively. FIG. 4 illustrates that, since the emitter size of the transistor 203 is smaller than the emitter size of the transistor 201, the collector current of the transistor 203 is also smaller than the collector current of the transistor 201. This allows the power amplifier circuit 10A to reduce the amount of current required to obtain a desired output power when in the low power mode.

Accordingly, the power amplifier circuit 10A can perform amplification suitable for the case where it is required to reduce the current value.

Figure 5:
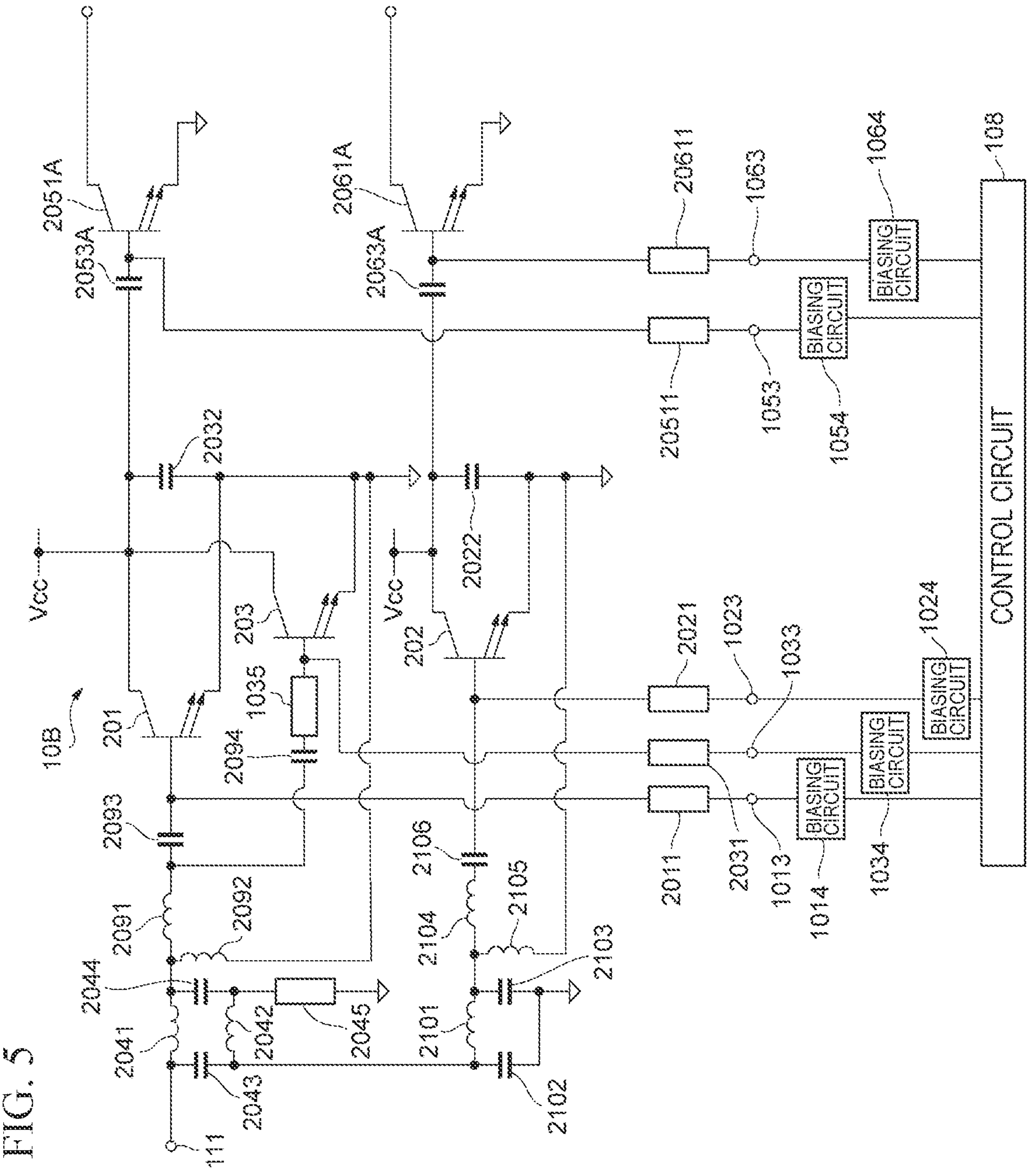
FIG. 5 is a circuit diagram of another power amplifier circuit according to the first embodiment.

As another circuit of the power amplifier circuit 10 according to the first embodiment, FIG. 5 illustrates a circuit diagram of a power amplifier circuit 10B. In the power amplifier circuit 10B, the amplifier section 105 in the power amplifier circuit 10 is configured of a transistor 2051A and a capacitor 2053A. In the power amplifier circuit 10B, the amplifier section 105 in the power amplifier circuit 10 is configured of a transistor 2061A and a capacitor 2063A. In the power amplifier circuit 10B, the point that the amplifiers 1051 and 1061 are realized without necessarily using a differential configuration is different from the power amplifier circuit 10A. This configuration also allows for the same effects as the power amplifier circuit 10 to be achieved.

A second embodiment will be described. From the second embodiment onward, matters common to the first embodiment will be omitted, and only differences will be described. In particular, the same or similar effects due to the same or similar configurations are not mentioned one by one in each embodiment.

Figure 6:
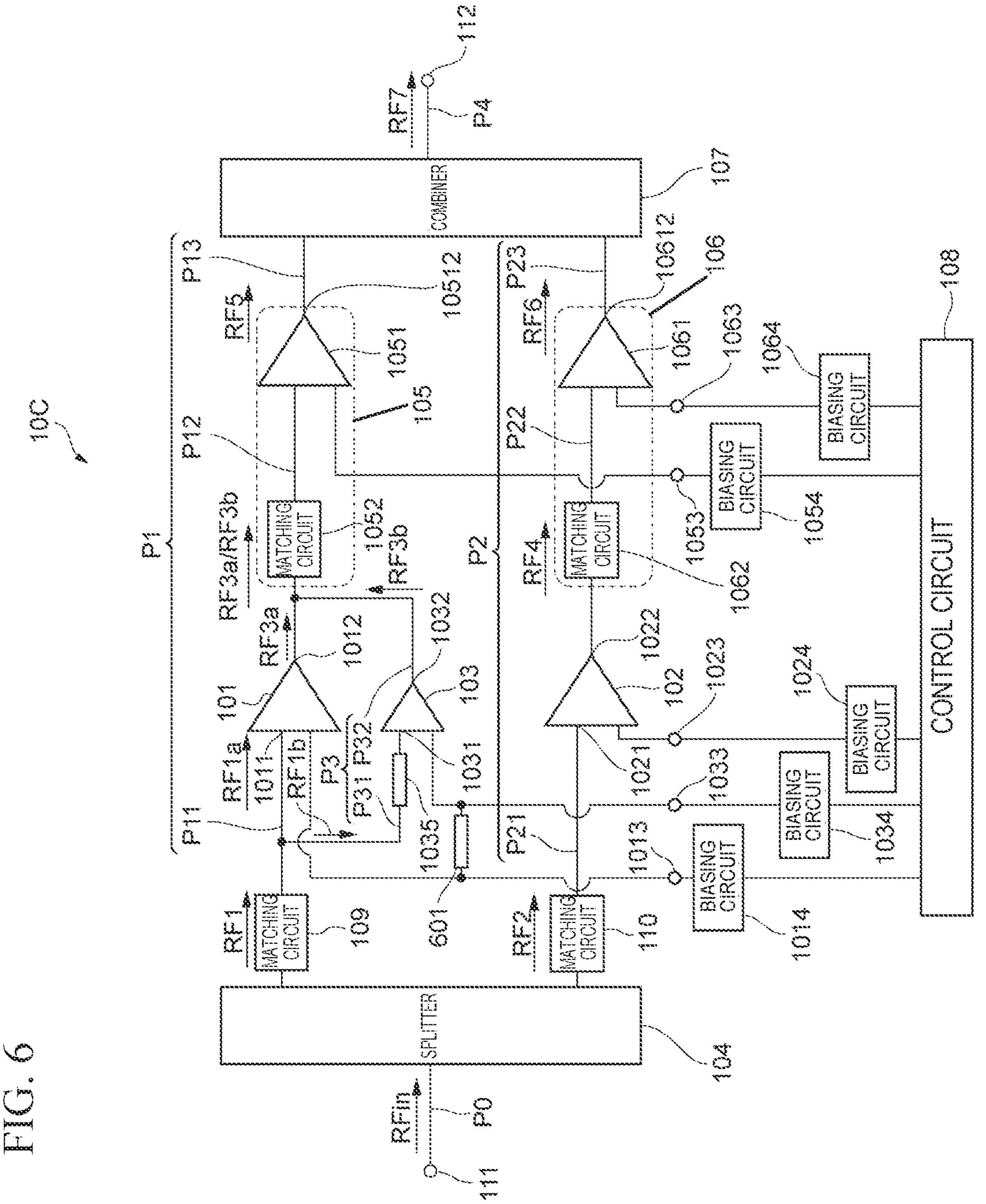
FIG. 6 is a block diagram of a power amplifier circuit according to a second embodiment.

Referring to FIG. 6, the second embodiment will be described. A power amplifier circuit 10C according to the second embodiment differs from the power amplifier circuit 10 in the point that an impedance element 601 (second impedance element) is provided to connect the biasing terminal 1013 and the biasing terminal 1033.

When the amplifier 101 and the amplifier 103 are switched depending on the mode, the impedance as seen from the splitter 104 towards the amplifier 101 or the amplifier 103 changes. Changes in impedance can deteriorate the voltage standing wave ratio (VSWR) of the signal RF1. By providing the impedance element 601, when power is amplified by either the amplifier 101 or the amplifier 103, the other amplifier, which does not perform power amplification, is also supplied with a certain bias current or voltage. This allows slight current to flow through the other amplifier, which performs no power amplification, and this other amplifier is not completely turned off. By not turning this other amplifier completely off, the above-mentioned changes in impedance can be suppressed and the deterioration of VSWR can be avoided.

Figure 7:
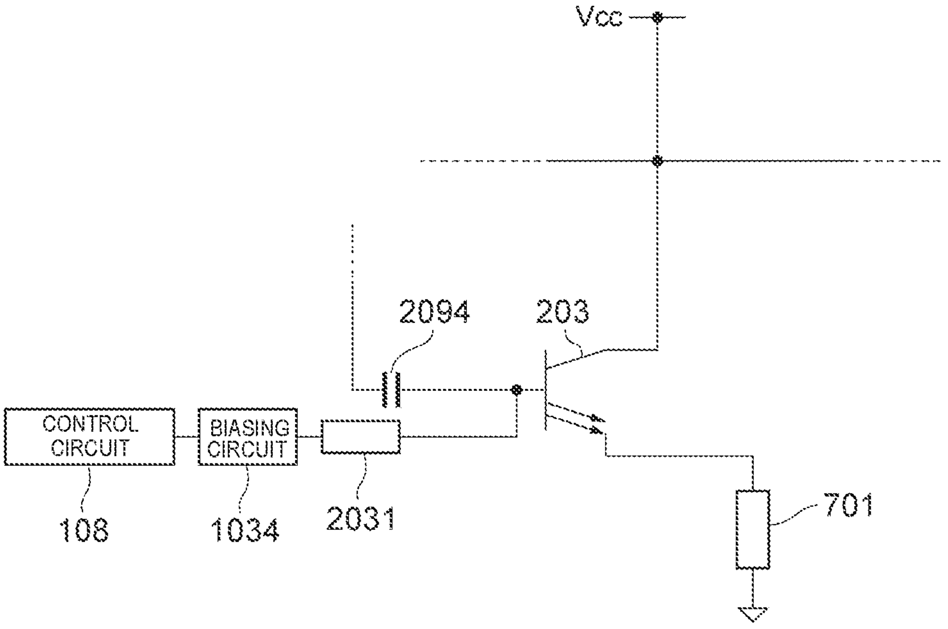
FIG. 7 is a diagram illustrating an example of the connection of an impedance element provided in the power amplifier circuit.
Figure 8:
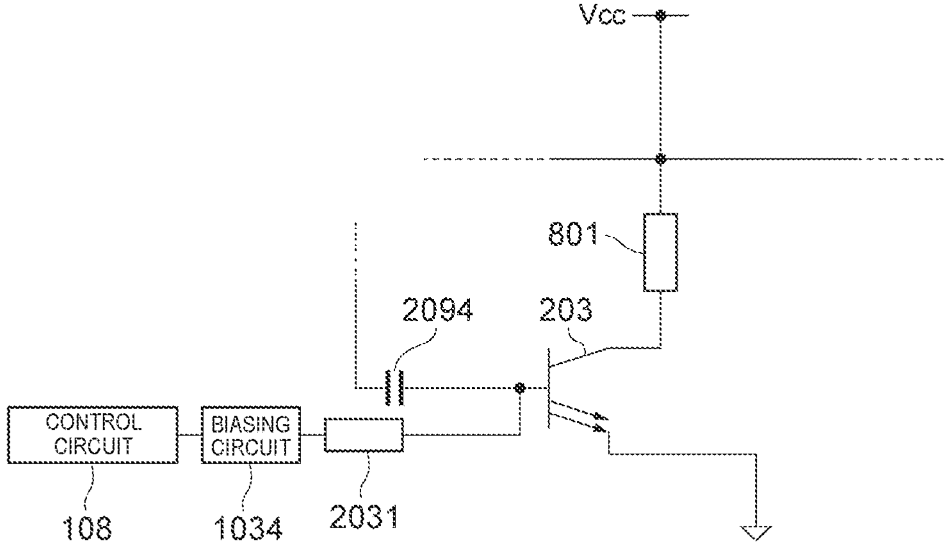
FIG. 8 is a diagram illustrating another example of the connection of an impedance element provided in the power amplifier circuit.
Figure 9:
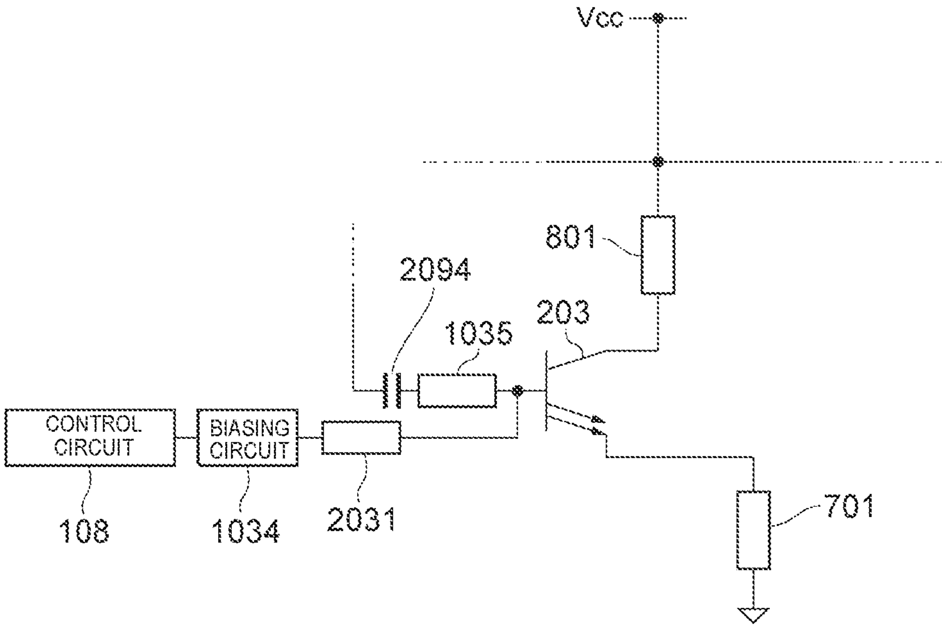
FIG. 9 is a diagram illustrating another example of the connection of impedance elements provided in the power amplifier circuit.

Referring to FIGS. 7 to 9, variations of the arrangement of one or more impedance elements in the power amplifier circuits 10 to 10C will be described. FIG. 7 excerpts and illustrates a circuit in the vicinity of the transistor 203 of the power amplifier circuit 10A. In the example illustrated in FIG. 7, an impedance element 701 is provided between the emitter of the transistor 203 and ground. When the transistor 203 performs signal amplification, power consumption by the impedance element 701 occurs. This configuration also allows for power consumption to occur in the low power mode, thus enabling the suppression of gain.

FIG. 8 illustrates, as another example, a configuration in which an impedance element 801 is connected to the collector of the transistor 203. FIG. 9 illustrates a configuration in the case where the impedance element 1035 and the impedance elements 701 and 801 in the power amplifier circuit 10A are provided. These configurations also allow for the suppression of gain in similar manners. That is, the impedance element(s) can be connected to the transistor 203 in any state, as long as the impedance element(s) can generate power consumption caused by current flowing due to power amplification.

Figure 10:
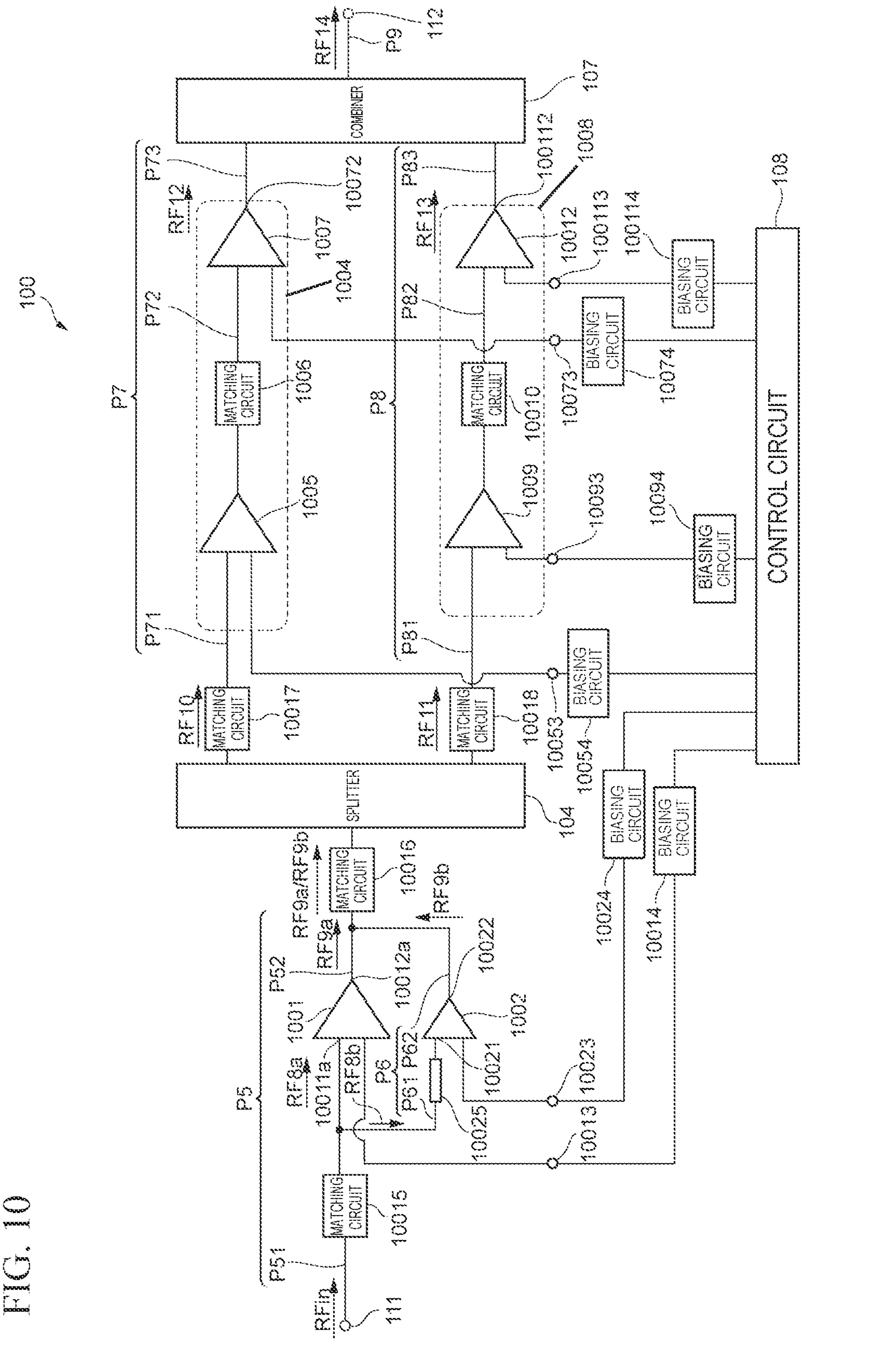
FIG. 10 is a block diagram of a power amplifier circuit according to a third embodiment.

Referring to FIG. 10, a third embodiment will be described. FIG. 10 illustrates a circuit diagram of a power amplifier circuit 100.

The power amplifier circuit 100 has amplifiers 1001 and 1002, amplifier sections 1004 and 1008, and the combiner 107.

The amplifier 1001 (fourth amplifier) is provided in or on the signal path P5 (fourth signal path). An input 10011*a* is connected to a signal path P51, which is part of the signal path P5, and is connected to the input end 111 through a matching circuit 10015. An output 10012*a* is connected to a signal path P52, which is part of the signal path P5.

The amplifier 1002 (fifth amplifier) is provided in or on the signal path P6 (fifth signal path), which branches from between the input 10011*a* of the amplifier 1001 and the input end 111 in the signal path P5. The amplifier 1002 is connected in parallel with the amplifier 1001. In the amplifier 1002, an input 10021 is connected to a signal path P61, which is part of the signal path P6. An output 10022 is connected to a signal path P62, which is part of the signal path P6. The amplifier 1002 is connected to the signal path P51 through an impedance element 10025 (third impedance element). The output 10022 of the amplifier 1002 is connected to the signal path P62 and is connected to the output 10012*a* of the amplifier 1001.

The splitter 104 is connected to the output 10012*a* of the amplifier 1001 and the output 10022 of the amplifier 1002 through a matching circuit 10016.

The splitter 104 is connected to a signal path P7 (sixth signal path) and a signal path P8 (seventh signal path) through matching circuits 10017 and 10018, respectively. The signal path P7 is provided with the amplifier section 1004 (third amplifier section). The amplifier section 1004 has an amplifier 1005, a matching circuit 1006, and an amplifier 1007. The signal path P7 has portions including signal paths P71, P72, and P73. The signal path P8 is provided with the amplifier section 1008 (fourth amplifier section). The amplifier section 1008 has an amplifier 1009, a matching circuit 10010, and an amplifier 10012. The signal path P8 has portions including signal paths P81, P82, and P83.

The amplifier 1001 is connected to a biasing circuit 10014 (fourth biasing circuit) through a biasing terminal 10013 (fourth biasing terminal). The amplifier 1002 is connected to a biasing circuit 10024 (fifth biasing circuit) through a biasing terminal 10023 (fifth biasing terminal). The amplifiers 1001 and 1002 are supplied with a bias current or voltage from the respective biasing circuits through the respective biasing terminals. The amplifiers 1001 and 1002 are turned on and perform power amplification when supplied with a bias current or voltage, and are turned off and perform no power amplification when supplied with no bias current or voltage.

The amplifier 1005 is connected to a biasing circuit 10054 (sixth biasing circuit) through a biasing terminal 10053. The amplifier 1007 is connected to a biasing circuit 10074 through a biasing terminal 10073. The amplifier 1009 is connected to a biasing circuit 10094 (seventh biasing circuit) through a biasing terminal 10093. The amplifier 10012 is connected to a biasing circuit 100124 through a biasing terminal 100123. The amplifiers 1005, 1007, 1009, and 10012 are turned on and perform power amplification when supplied with a bias current or voltage, and are turned off and perform no power amplification when supplied with no bias current or voltage.

The amplifiers 1005 and 1007 are carrier amplifiers in the power amplifier circuit 100 operating as a Doherty amplifier. The amplifiers 1009 and 10012 are peak amplifiers in the power amplifier circuit 100 operating as a Doherty amplifier.

The combiner 107 is provided to be connected to the signal path P7 and the signal path P8. The combiner 107 combines a signal RF12 input through the signal path P7 and a signal RF13 input through the signal path P8. The combined signal is output as a signal RF14 to the output end 112 through a signal path P9.

The control circuit 108 is connected to the biasing circuits 10014, 10024, 10054, 10074, 10094, and 100114. The control circuit 108 switches each biasing circuit on and off by sending a control signal to each biasing circuit. Each biasing circuit operates to be able to supply a bias current or voltage when it is on and not to supply a bias current or voltage when it is off.

In the power amplifier circuit 100, when in the high power mode, bias is supplied to turn on the amplifier 1001 and turn off the amplifier 1002. In addition, each amplifier is biased so that both of the amplifier sections 1004 and 1008 perform amplification. The input signal RFin is input as a signal RF8*a* to the amplifier 1001. The signal RF8*a* is amplified by the amplifier 1001 and input as a signal RF9*a* to the splitter 104. The signal RF9*a* is split to a signal RF10 (seventh signal) and a signal RF11 (eighth signal), and these signals go through the amplifier sections 1004 and 1008 to become the signal RF12 (ninth signal) and the signal RF13 (tenth signal), respectively. The signals RF12 and RF13 are combined by the combiner 107 and output as the signal RF14 (eleventh signal) to the output end 112 through the signal path P9.

In the low power mode, bias is supplied to turn off the amplifier 1001 and turn on the amplifier 1002. In addition, each amplifier is biased so that only the amplifier section 1004 performs amplification. In the low power mode, the input signal RFin is input as a signal RF8*b* to the amplifier 1001. The signal RF8*b* is amplified by the amplifier 1002 and input as a signal RF9*b* to the splitter 104. In the low power mode, only the signal RF10 from the splitter 104 is amplified by the amplifier section 1004.

In the middle power mode, bias is supplied to turn on the amplifier 1001 and turn off the amplifier 1002. In addition, each amplifier is biased so that only the amplifier section 1004 performs amplification, the amplifier section 1004 is on, and the amplifier section 1008 is off. In the middle power mode, the input signal RFin is input as the signal RF8*a* to the amplifier 1001. The signal RF8*a* is amplified by the amplifier 1002 and input as the signal RF9*a* to the splitter 104. In the low power mode, only the signal RF10 from the splitter 104 is amplified by the amplifier section 1004.

Also in the power amplifier circuit 100, power consumption by the impedance element 10025 occurs, and the amplitude of the signal decreases, enabling the suppression of gain, like the power amplifier circuit 10.

Figure 11:
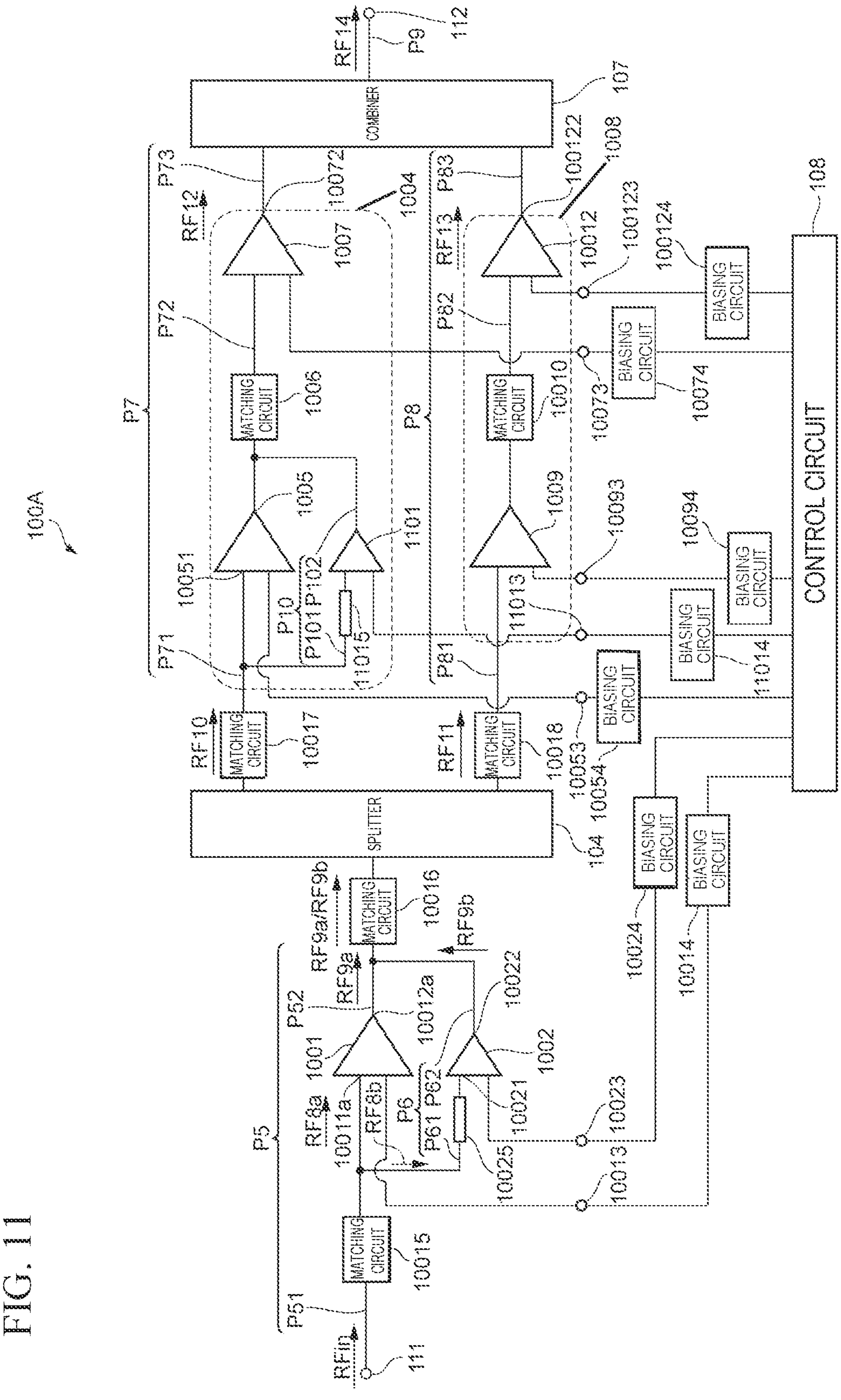
FIG. 11 is a block diagram of a power amplifier circuit according to a fourth embodiment.

Referring to FIG. 11 a fourth embodiment will be described. FIG. 11 illustrates a block diagram of a power amplifier circuit 100A according to the fourth embodiment. The power amplifier circuit 100A is a circuit that incorporates the configuration of the power amplifier circuit 10 into the power amplifier circuit 100.

The power amplifier circuit 100A has a signal path P10 branching from the signal path P7. An amplifier 1101 is provided in or on the signal path P10, which branches from between an input 10051 of the amplifier 1005 and the splitter 104. The amplifier 1101 is connected in parallel with the amplifier 1005. The input of the amplifier 1101 is connected to a signal path P101, which is part of the signal path P10. The output of the amplifier 1101 is connected to a signal path P102, which is part of the signal path P10. The amplifier 1101 is connected to the signal path P71 through an impedance element 11015. The output of the amplifier 1101 is connected to the signal path P72 and is connected to the output of the amplifier 1005. The amplifier 1101 is connected to a biasing circuit 11014 through a biasing terminal 11013.

In the power amplifier circuit 100A, the signal RF10 can be amplified by the amplifier 1101 and the amplifier 1007 in the low power mode, like the case of the power amplifier circuit 100.
This can further suppress the gain through power consumption by the impedance element 11015 and the impedance element 10025.

Figure 12:
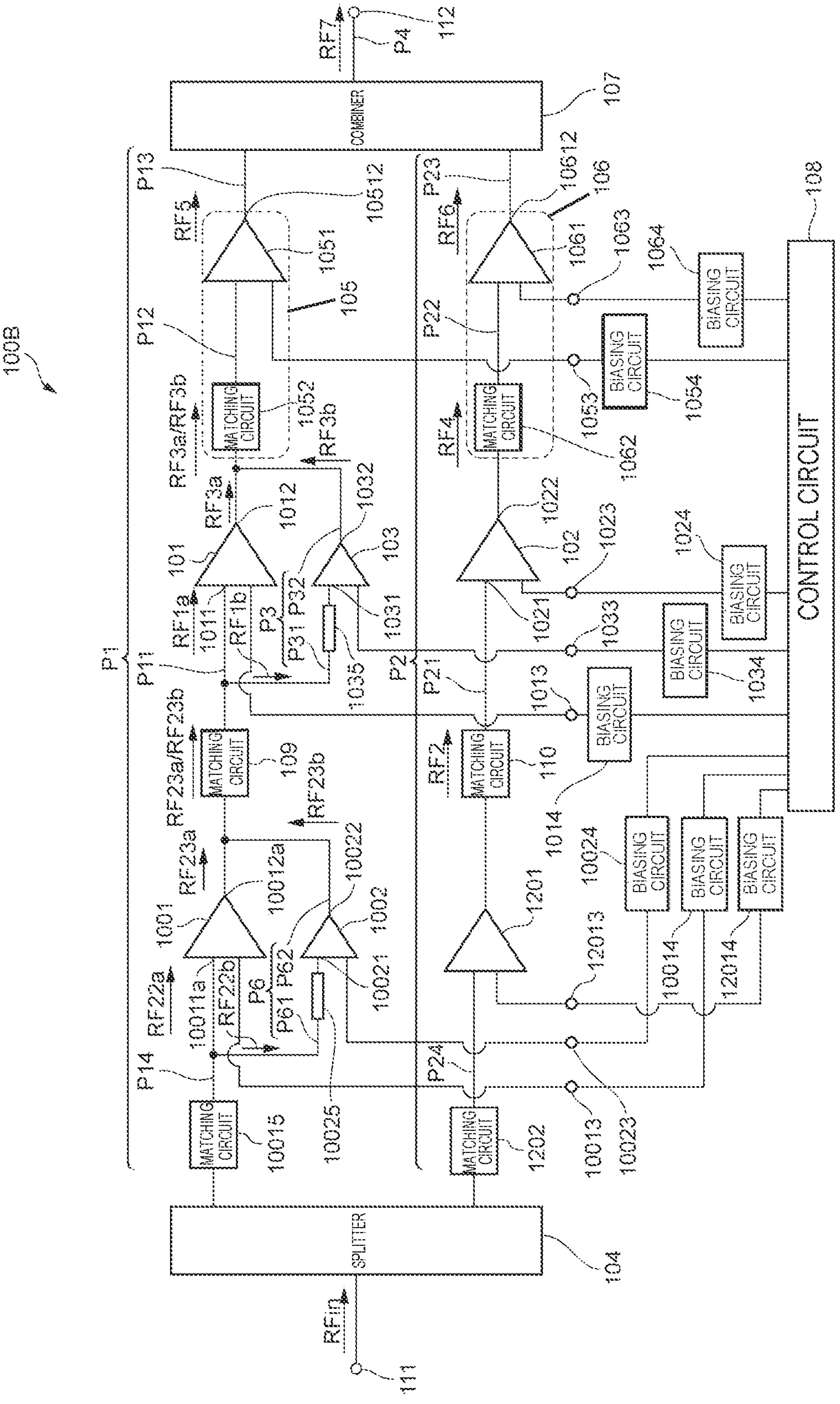
FIG. 12 is a block diagram of a power amplifier circuit according to a fifth embodiment.

Referring to FIG. 12, a fifth embodiment will be described. FIG. 12 illustrates a block diagram of a power amplifier circuit 100B according to the fifth embodiment.

In the power amplifier circuit 100B, the configuration of the amplifier 1001 and the amplifier 1002 according to the power amplifier circuit 100 is provided in a stage before the amplifier 101. Also, in the power amplifier circuit 100B, an amplifier 1201 and a matching circuit 1202 are provided in a stage before the amplifier 102. The amplifier 1201 is connected to a biasing circuit 12014 through a biasing terminal 12013.
In the power amplifier circuit 100B, due to the addition of circuit elements from the power amplifier circuit 10, a signal path P14 and a signal path P24 are added to the signal paths P1 and P2, respectively.

In the power amplifier circuit 100B, the amplifier 1001 or the amplifier 1002 is biased according to the power mode. The amplifier 1001 amplifies a signal RF22*a* to output a signal RF23*a*. The amplifier 1002 amplifies a signal RF22*b* to output a signal RF23*b*. In the power amplifier circuit 100B, the signal RF1 in the power amplifier circuit 10 corresponds to the signal RF23*a* or signal RF23*b* amplified by the amplifier 1001.

In the power amplifier circuit 100B, signals from the splitter 104 can be amplified by the amplifier 1002 and the amplifier 103 in the low power mode, like the case of the power amplifier circuit 10. This can further suppress the gain, like the power amplifier circuit 100A.

As in the third to fifth embodiments, in a power amplifier circuit that includes a plurality of amplifiers provided in or on branching signal paths, amplifiers to be biased can be appropriately combined according to the power mode. For example, in the example illustrated in FIG. 12, there are four combinations that allow either the amplifier 1001 or 1002 and either the amplifier 101 or 103 to be biased. The control circuit 108 is configured to perform optimal power amplification according to the input signal by coordinating these combinations. This allows for finer gain adjustments.

Moreover, in the third to fifth embodiments, the emitter size may be changed as in the power amplifier circuit 10A, an impedance element that connects the biasing terminals may be provided, or impedance elements provided in or on the branching signal paths may be provided as in FIGS. 7 to 9.

The exemplary embodiments of the present disclosure have been described so far. The power amplifier circuit 10 includes: the input signal path P0 to which the input signal RFin is input; the splitter 104 connected to the input signal path P0 and outputting the input signal RFin by splitting the input signal RFin to the signal RF1 and the signal RF2; the signal path P1 connected to the splitter 104 and receiving the signal RF1; the signal path P2 connected to the splitter 104 and receiving the signal RF2; the amplifier 101 provided in or on the signal path P1 and connected to the biasing terminal 1013 supplied with the first bias current or voltage; the amplifier 102 provided in or on the signal path P2 and connected to the biasing terminal 1023 supplied with the second bias current or voltage; the signal path P3 branching from between the splitter 104 and the input 1011 of the amplifier 101; and the amplifier 103 provided in or on the signal path P3, connected in parallel with the amplifier 101, and connected to the biasing terminal 1033 supplied with the third bias current or voltage.

The power amplifier circuit 10 includes: the impedance element 1035 provided in or on the signal path P3 and connected to the amplifier 103; the amplifier section 105 provided in or on the signal path P1, connected to the output 1012 of the amplifier 101 and the output 1032 of the amplifier 103, and outputting the signal RF5 based on the signal RF1; the amplifier section 106 provided in or on the signal path P2, connected to the output 1022 of the amplifier 102, and outputting the signal RF6 based on the signal RF2; and the combiner 107 connected to the signal path P1 and the signal path P2, and outputting the signal RF7 combining the signal RF5 and the signal RF6.

The power amplifier circuit 10 is configured to be able to supply a bias current or voltage to the amplifier 103 when operating in a low power mode. In the low power mode, the amplifier 103 functions as a driver stage. A signal supplied to the amplifier 103 consumes power in the impedance element 1035. This makes it possible to reduce the gain of the power amplifier circuit 10 in the low power mode compared to the case where no impedance element is provided. Note that the signal path P3 may be provided with a circuit in which two or more impedance elements, which are resistive elements, capacitors, or inductors, are combined.

The power amplifier circuit 10 further includes: the biasing circuit 1014 supplying the first bias current or voltage through the biasing terminal 1013; the biasing circuit 1024 supplying the second bias current or voltage through the biasing terminal 1023; the biasing circuit 1034 supplying the third bias current or voltage through the biasing terminal 1033; and the control circuit 108 controlling the biasing circuit 1014, the biasing circuit 1024, and the biasing circuit 1034.

The control circuit 108 controls the biasing circuit 1014, the biasing circuit 1024, and the biasing circuit 1034 in the first power mode such that the first bias current or voltage is supplied to the amplifier 101, the second bias current or voltage is supplied to the amplifier 102, and the third bias current or voltage is not supplied to the amplifier 103.

The control circuit 108 controls the biasing circuit 1014, the biasing circuit 1024, and the biasing circuit 1034 in the second power mode whose power level is lower than the first power mode such that the first bias current or voltage is not supplied to the amplifier 101, the second bias current or voltage is not supplied to the amplifier 102, and the third bias current or voltage is supplied to the amplifier 103.

This makes it possible to perform power amplification while controlling the suppression of gain in the power amplifier circuit 10 using the control circuit 108.

Moreover, the control circuit 108 controls the biasing circuit 1014, the biasing circuit 1024, and the biasing circuit 1034 in the third power mode whose power level is lower than the first power mode and higher than the second power mode such that the first bias current or voltage is supplied to the amplifier 101, the second bias current or voltage is not supplied to the amplifier 102, and the third bias current or voltage is not supplied to the amplifier 103.

By providing the amplifier 103 and performing control using the control circuit 108, power amplification can be performed while having multiple power modes. Even in this case, the gain can be suppressed.

Also, in the power amplifier circuit 10A, the amplifier 101 is the transistor 201, the amplifier 103 is the transistor 203, and the emitter size of the transistor 203 is smaller than the emitter size of the transistor 201.

This allows the power amplifier circuit 10A to reduce the amount of current required to obtain the desired output power when in the low power mode.

The power amplifier circuit 10 may also include the impedance element 701 provided to connect the amplifier 103 and ground. The power amplifier circuit 10 may also include the impedance element 801 provided to connect the amplifier 103 and a power supply supplied to the amplifier 103. These configurations also allow for power consumption by the impedance element 701 or the impedance element 801 to occur in the low power mode, thus enabling the suppression of gain.

Furthermore, the power amplifier circuit 10C includes the impedance element 601 having one end connected to the biasing terminal 1013 and another end connected to the biasing terminal 1033. This allows the other amplifier, which performs no power amplification, to be not completely off. By not turning this other amplifier completely off, changes in impedance due to switching on the amplifier 101 or the amplifier 103 can be suppressed, and deterioration of VSWR can be avoided.

Furthermore, the power amplifier circuit 100 includes: the signal path P5 to which the input signal RFin is input through the input end 111; the amplifier 1001 provided in or on the signal path P5 and connected to the biasing terminal 10013 supplied with a fourth bias current or voltage; the signal path P6 branching from between the input end 111 and the input 10011*a* of the amplifier 1001; and the amplifier 1002 provided in or on the signal path P6, connected in parallel with the amplifier 1001, and connected to the biasing terminal 10023 supplied with a fifth bias current or voltage.

The power amplifier circuit 100 includes: the impedance element 10025 provided in or on the signal path P6, having one end connected to an input of the amplifier 1001, and another end connected to an input of the amplifier 1002; the splitter 104 connected to the output 10012*a* of the amplifier 1001 and the output 10022 of the amplifier 1002, and outputting a signal based on the input signal RFin by splitting the signal to the signal RF10 and the signal RF11; the signal path P7 connected to the splitter 104 and receiving the signal RF10; the signal path P8 connected to the splitter 104 and receiving the signal RF11; the amplifier section 1004 provided in or on the signal path P7 and outputting the signal RF12 based on the signal RF10; the amplifier section 1008 provided in or on the signal path P8 and outputting the signal RF13 based on the signal RF11; and a combiner connected to the output 10072 of the amplifier 1007 and the output 10012*a*2 of the amplifier 10012, and outputting the signal RF14 combining the signal RF12 and the signal RF13.

In the low power mode, the amplifier 1002 functions as a driver stage common to the amplifier section 1004 and the amplifier section 1008. A signal supplied to the amplifier 1002 consumes power in the impedance element 10025. This makes it possible to reduce the gain of the power amplifier circuit 10 in the low power mode compared to the case where no impedance element is provided.

In addition, the power amplifier circuit 100 includes: the biasing circuit 10014 supplying the fourth bias current or voltage through the biasing terminal 10013; the biasing circuit 10024 supplying the fifth bias current or voltage through the biasing terminal 10023; and the control circuit 108 controlling the biasing circuit 10014 and the biasing circuit 10024.

In the power amplifier circuit, the control circuit 108 controls the biasing circuit 10014 and the biasing circuit 10024 in a fourth power mode such that the fourth bias current or voltage is supplied to the amplifier 1001 and the fifth bias current or voltage is not supplied to the amplifier 1002, and controls the biasing circuit 10014 and the biasing circuit 10024 in a fifth power mode whose power level is lower than the fourth power mode such that the fourth bias current or voltage is not supplied to the amplifier 1001 and the fifth bias current or voltage is supplied to the amplifier 1002.

This makes it possible to perform power amplification while controlling the suppression of gain in the power amplifier circuit 100 using the control circuit 108.

The power amplifier circuit 100 further includes: the biasing circuit 10054 supplying a sixth bias current or voltage to the amplifier section 1004; and the biasing circuit 10094 supplying a seventh bias current or voltage to the amplifier section 1008. The control circuit 108 further controls the biasing circuit 10054 and the biasing circuit 10094. The control circuit 108 controls the biasing circuit 10054 and the biasing circuit 10094 in a sixth power mode whose power level is lower than the fourth power mode and higher than the fifth power mode such that the fourth bias current or voltage is not supplied to the amplifier 1001, the fifth bias current or voltage is supplied to the amplifier 1002, the sixth bias current or voltage is supplied to the amplifier section 1004, and the seventh bias current or voltage is not supplied to the amplifier section 1008.

This makes it possible for the power amplifier circuit 100 to perform power amplification while having multiple power modes. Even in this case, the gain can be suppressed.

Note that each of the embodiments described above is for the purpose of facilitating the understanding of the present disclosure and is not construed to limit the interpretation of the present disclosure. The present disclosure may be changed/improved without necessarily departing from its spirit, and the present disclosure also includes equivalents thereof. That is, appropriate design changes made by those skilled in the art to each embodiment are also encompassed within the scope of the present disclosure as long as they have the features of the present disclosure. For example, each element provided in each embodiment and its arrangement, material, conditions, shape, size, etc., are not limited to those illustrated and can be changed accordingly. Also, each embodiment is exemplary, and it goes without necessarily saying that partial substitutions or combinations of the configurations described in different embodiments are possible, which are also encompassed within the scope of the present disclosure as long as they have the features of the present disclosure.

REFERENCE SIGNS LIST

10, 10A, 10B, 10C, 100, 100A, and 100B . . . power amplifier circuit; 101, 102, and 103 . . . amplifiers; 104 . . . splitter; 105 and 106 . . . amplifiers; 107 . . . combiner; and 108 . . . control circuit

The invention claimed is:

1. A power amplifier circuit comprising:

an input signal path to which an input signal is input;

a splitter connected to the input signal path, and configured to split the input signal into a first signal and a second signal and to output the first signal and the second signal;

a first signal path connected to the splitter and through which the first signal travels;

a second signal path connected to the splitter and through which the second signal travels;

a first amplifier in the first signal path and connected to a first biasing terminal, the first amplifier being supplied with a first bias current or a first bias voltage from the first biasing terminal;

a second amplifier in the second signal path and connected to a second biasing terminal, the second amplifier being supplied with a second bias current or a second bias voltage from the second biasing terminal;

a third signal path branching from a node between the splitter and an input of the first amplifier;

a third amplifier in the third signal path, connected in parallel with the first amplifier, and connected to a third biasing terminal, the third amplifier being supplied with a third bias current or a third bias voltage from the third biasing terminal;

at least one impedance circuit element connected to the third amplifier;

a first amplifier section in the first signal path, connected to an output of the first amplifier and to an output of the third amplifier, and configured to output a third signal based on the first signal;

a second amplifier section in the second signal path, connected to an output of the second amplifier, and configured to output a fourth signal based on the second signal; and a combiner connected to the first signal path and to the second signal path, and configured to combine the third signal and the fourth signal and to output a fifth signal.

2. The power amplifier circuit according to claim 1, further comprising:

a first biasing circuit configured to supply the first bias current or the first bias voltage through the first biasing terminal;

a second biasing circuit configured to supply the second bias current or the second bias voltage through the second biasing terminal;

a third biasing circuit configured to supply the third bias current or the third bias voltage through the third biasing terminal; and a control circuit configured to control the first biasing circuit, the second biasing circuit, and the third biasing circuit, wherein the control circuit is configured to:

control the first biasing circuit, the second biasing circuit, and the third biasing circuit in a first power mode such that the first bias current or the first bias voltage is supplied to the first amplifier, the second bias current or the second bias voltage is supplied to the second amplifier, and the third bias current or the third bias voltage is not supplied to the third amplifier, and control the first biasing circuit, the second biasing circuit, and the third biasing circuit in a second power mode in which a power level is lower than in the first power mode such that the first bias current or the first voltage is not supplied to the first amplifier, the second bias current or the second bias voltage is not supplied to the second amplifier, and the third bias current or the third bias voltage is supplied to the third amplifier.

3. The power amplifier circuit according to claim 2, wherein in a third power mode in which the power level is lower than in the first power mode and higher than in the second power mode, the control circuit is configured to control the first biasing circuit, the second biasing circuit, and the third biasing circuit such that the first bias current or the first bias voltage is supplied to the first amplifier, the second bias current or the second bias voltage is not supplied to the second amplifier, and the third bias current or the third bias voltage is not supplied to the third amplifier.

4. The power amplifier circuit according to claim 1, wherein the first amplifier is a first transistor;

wherein the third amplifier is a second transistor; and wherein an emitter size of the second transistor is smaller than an emitter size of the first transistor.

5. The power amplifier circuit according to claim 1, wherein at least one of the impedance circuit elements has a first end connected to the input of the first amplifier and a second end connected to an input of the third amplifier.

6. The power amplifier circuit according to claim 1, wherein at least one of the impedance circuit elements is connected between the third amplifier and ground.

7. The power amplifier circuit according to claim 1, wherein at least one of the impedance circuit elements is connected between the third amplifier and a power supply configured to supply power to the third amplifier.

8. The power amplifier circuit according to claim 1, comprising at least two impedance circuit elements, wherein at least one of the impedance circuit elements has a first end connected to the first biasing terminal and a second end connected to the third biasing terminal.

9. A power amplifier circuit comprising:

a fourth signal path to which an input signal is input through an input end;

a fourth amplifier in the fourth signal path and connected to a fourth biasing terminal, the fourth amplifier being supplied with a fourth bias current or a fourth bias voltage from the fourth biasing terminal;

a fifth signal path branching from a node between the input end and an input of the fourth amplifier;

a fifth amplifier in the fifth signal path, connected in parallel with the fourth amplifier, and connected to a fifth biasing terminal, the fifth amplifier being supplied with a fifth bias current or a fifth bias voltage from the fifth biasing terminal;

at least one impedance circuit element in the fifth signal path, having a first end connected to the input of the fourth amplifier, and a second end connected to an input of the fifth amplifier;

a splitter connected to an output of the fourth amplifier and to an output of the fifth amplifier, and configured to split the input signal into a seventh signal and an eighth signal and to output the seventh signal and the eighth signal;

a sixth signal path connected to the splitter and through which the seventh signal travels;

a seventh signal path connected to the splitter and through which the eighth signal travels;

a third amplifier section in the sixth signal path and configured to output a ninth signal based on the seventh signal;

a fourth amplifier section in the seventh signal path and configured to output a tenth signal based on the eighth signal; and a combiner connected to an output of the third amplifier section and to an output of the fourth amplifier section, and configured to combine the ninth signal and the tenth signal and to output an eleventh signal.

10. The power amplifier circuit according to claim 9, further comprising:

a fourth biasing circuit configured to supply the fourth bias current or the fourth bias voltage through the fourth biasing terminal;

a fifth biasing circuit configured to supply the fifth bias current or the fifth bias voltage through the fifth biasing terminal; and a control circuit configured to control the fourth biasing circuit and the fifth biasing circuit, wherein the control circuit is configured to:

control the fourth biasing circuit and the fifth biasing circuit in a fourth power mode such that the fourth bias current or the fourth bias voltage is supplied to the fourth amplifier, and the fifth bias current or the fifth bias voltage is not supplied to the fifth amplifier, and control the fourth biasing circuit and the fifth biasing circuit in a fifth power mode in which a power level is lower than in the fourth power mode such that the fourth bias current or the fourth bias voltage is not supplied to the fourth amplifier, and the fifth bias current or the fifth bias voltage is supplied to the fifth amplifier.

11. The power amplifier circuit according to claim 10, further comprising:

a sixth biasing circuit configured to supply a sixth bias current or a sixth bias voltage to the third amplifier section; and a seventh biasing circuit configured to supply a seventh bias current or a seventh bias voltage to the fourth amplifier section, wherein the control circuit is further configured to control the sixth biasing circuit and the seventh biasing circuit, and wherein in a sixth power mode in which the power level is lower than in the fourth power mode and higher than in the fifth power mode, the control circuit is configured to control the fourth biasing circuit and the fifth biasing circuit such that the fourth bias current or the fourth bias voltage is not supplied to the fourth amplifier, the fifth bias current or the fifth bias voltage is supplied to the fifth amplifier, the sixth bias current or the sixth bias voltage is not supplied to the third amplifier, and the seventh bias current or the seventh bias voltage is not supplied to the fourth amplifier.

12. The power amplifier circuit according to claim 9, wherein the fourth amplifier is a third transistor;

wherein the fifth amplifier is a fourth transistor; and wherein an emitter size of the fourth transistor is smaller than an emitter size of the third transistor.

13. The power amplifier circuit according to claim 9, wherein at least one of the impedance circuit elements has a first end connected to the input of the fourth amplifier and a second end connected to the input of the fifth amplifier.

14. The power amplifier circuit according to claim 9, wherein at least one of the impedance circuit elements is connected between the fifth amplifier and ground.

15. The power amplifier circuit according to claim 9, wherein at least one of the impedance circuit elements is connected between the fifth amplifier and a power supply configured to supply power to the fifth amplifier.

16. The power amplifier circuit according to claim 9, comprising at least two impedance circuit elements, wherein at least one of the impedance circuit elements has a first end connected to the fourth biasing terminal and a second end connected to the fifth biasing terminal.

17. A power amplifier circuit comprising:

an input signal path to which an input signal is input;

a splitter connected to the input signal path, and configured to split the input signal to a first signal and a second signal and to output the first signal and the second signal;

a first signal path connected to the splitter and through which the first signal travels;

a second signal path connected to the splitter and through which the second signal travels;

a first amplifier in the first signal path and connected to a first biasing terminal, the first amplifier being supplied with a first bias current or a first bias voltage from the first biasing terminal;

a second amplifier in the second signal path and connected to a second biasing terminal, the second amplifier being supplied with a second bias current or a second bias voltage from the second biasing terminal;

a third signal path branching from a node between the splitter and an input of the first amplifier;

a third amplifier in the third signal path, connected in parallel with the first amplifier, and connected to a third biasing terminal, the third amplifier being supplied with a third bias current or a third bias voltage from the third biasing terminal;

at least one circuit impedance element connected to the third amplifier; and a combiner connected to the first signal path and to the second signal path, and configured to combine a third signal based on the first signal and a fourth signal based on the second signal, and to output a fifth signal.

18. The power amplifier circuit according to claim 17, wherein the first amplifier is a first transistor;

wherein the third amplifier is a second transistor; and wherein an emitter size of the second transistor is smaller than an emitter size of the first transistor.

19. The power amplifier circuit according to claim 17, further comprising:

a first biasing circuit configured to supply the first bias current or the first bias voltage through the first biasing terminal;

a second biasing circuit configured to supply the second bias current or the second bias voltage through the second biasing terminal;

a third biasing circuit configured to supply the third bias current or the third bias voltage through the third biasing terminal; and a control circuit configured to control the first biasing circuit, the second biasing circuit, and the third biasing circuit, wherein the control circuit is configured to:

control the first biasing circuit, the second biasing circuit, and the third biasing circuit in a first power mode such that the first bias current or the first bias voltage is supplied to the first amplifier, the second bias current or the second bias voltage is supplied to the second amplifier, and the third bias current or the third bias voltage is not supplied to the third amplifier, and control the first biasing circuit, the second biasing circuit, and the third biasing circuit in a second power mode in which a power level is lower than in the first power mode such that the first bias current or the first bias voltage is not supplied to the first amplifier, the second bias current or the second bias voltage is not supplied to the second amplifier, and the third bias current or the third bias voltage is supplied to the third amplifier.

20. The power amplifier circuit according to claim 19, wherein in a third power mode in which the power level is lower than in the first power mode and higher than in the second power mode, the control circuit is configured to control the first biasing circuit, the second biasing circuit, and the third biasing circuit such that the first bias current or the first bias voltage is supplied to the first amplifier, the second bias current or the second bias voltage is not supplied to the second amplifier, and the third bias current or the third bias voltage is not supplied to the third amplifier.

* * * * *